United States Patent [19]

Engel et al.

[11] 4,139,839

[45] Feb. 13, 1979

[54] DIGITAL DATA REFORMATTER/DESERIALIZER

[76] Inventors: James C. Fletcher, Administrator of the National Aeronautics and Space Administration, with respect to an invention of Alexander Engel, La Canada; L. Richard Springer, Glendale, both of Calif.

[21] Appl. No.: 779,415

[22] Filed: Mar. 18, 1977

[51] Int. Cl.² .............................................. G06F 5/04
[52] U.S. Cl. .............................. 340/347 DD; 364/900
[58] Field of Search ................ 340/347 DD, 146.1 R, 340/146.1 AL; 364/900; 235/92 SH; 178/22; 179/1.5 S

[56] References Cited

U.S. PATENT DOCUMENTS

| | | | |
|---|---|---|---|
| 3,235,661 | 2/1966 | Oxley | 340/347 DD |
| 3,657,699 | 4/1972 | Rocher | 340/146.1 R |
| 3,764,991 | 10/1973 | Metzenthen | 364/900 |
| 4,041,453 | 8/1977 | Umeda | 340/347 DD |

Primary Examiner—Charles D. Miller
Attorney, Agent, or Firm—Monte F. Mott; John R. Manning; Paul F. McCaul

[57] ABSTRACT

Disclosed is a method and apparatus for reformatting and de-serializing a serially-received sequence of data words, each consisting of a fixed number of binary data bits. A block of nm bits is serially fed into a shift register or serially-connected group of shift registers. In lieu of the (nm - 1)th shift, the bits are rearranged within the shift register in parallel fashion, according to a prescribed scheme. Shifting then continues, until the first bit of each data word appears in the last bit position in the shift register, at which time that data word is shifted in parallel into an output buffer stage, from which it is outputted in parallel, after a fixed delay.

14 Claims, 8 Drawing Figures

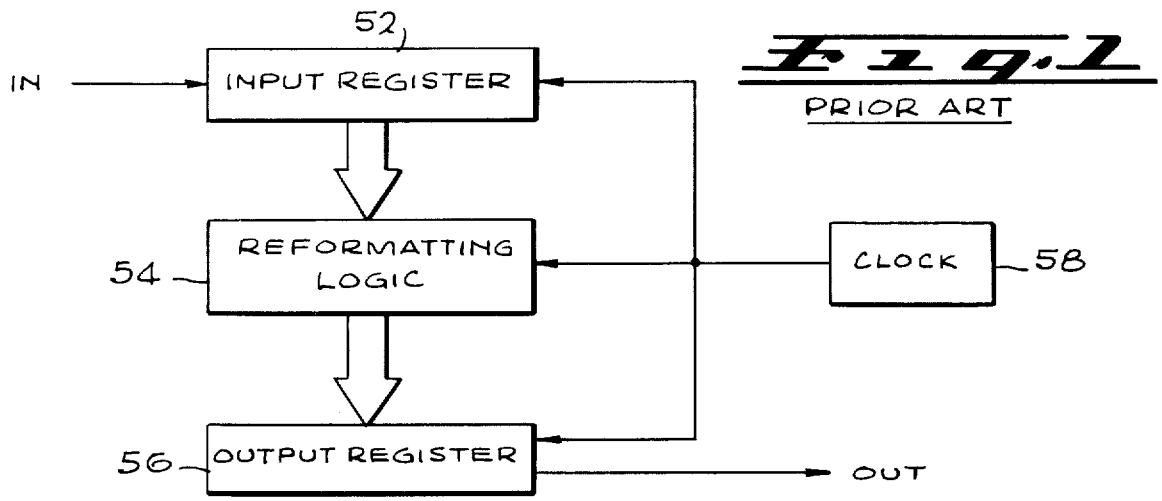
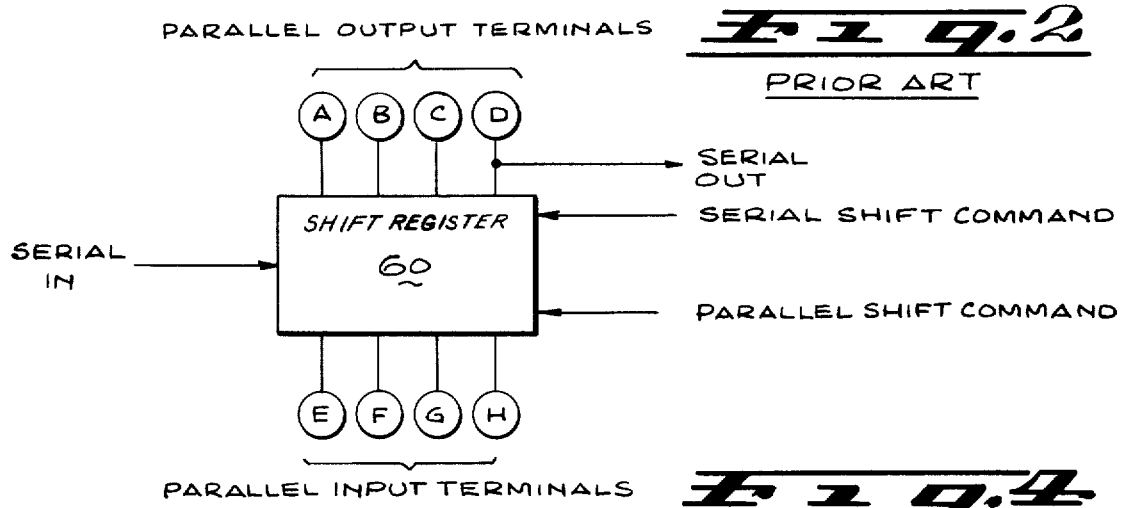
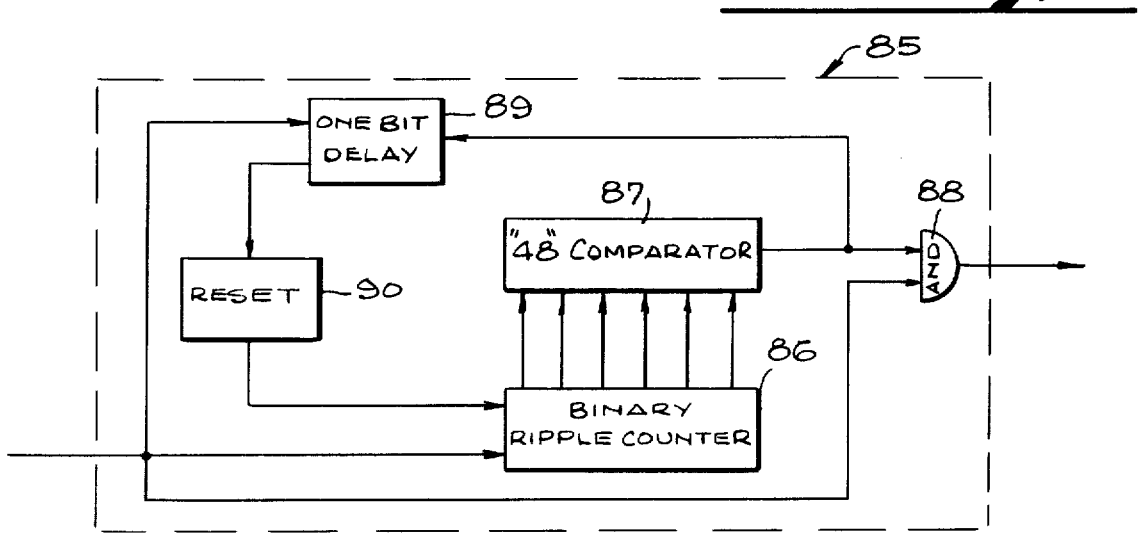

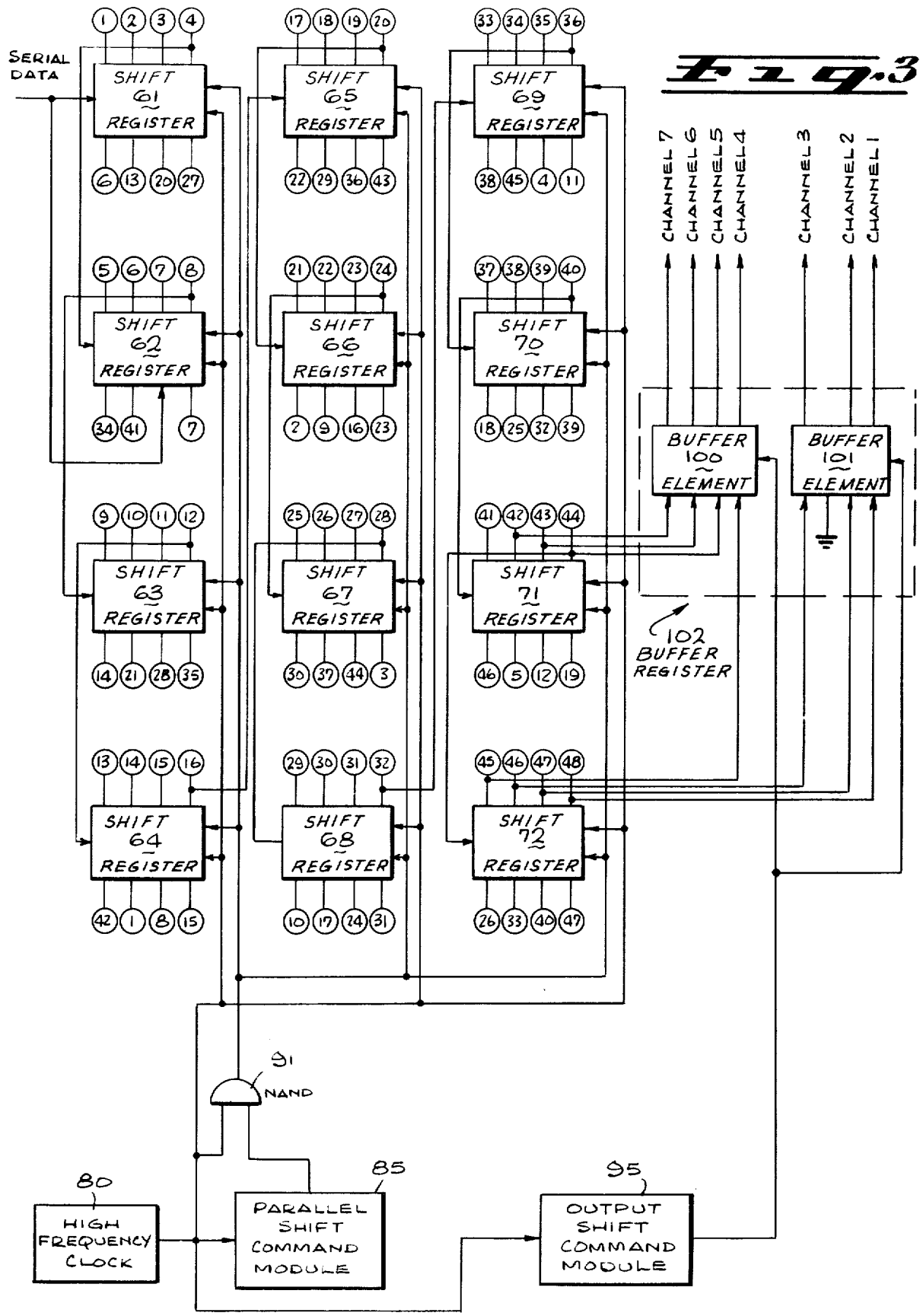

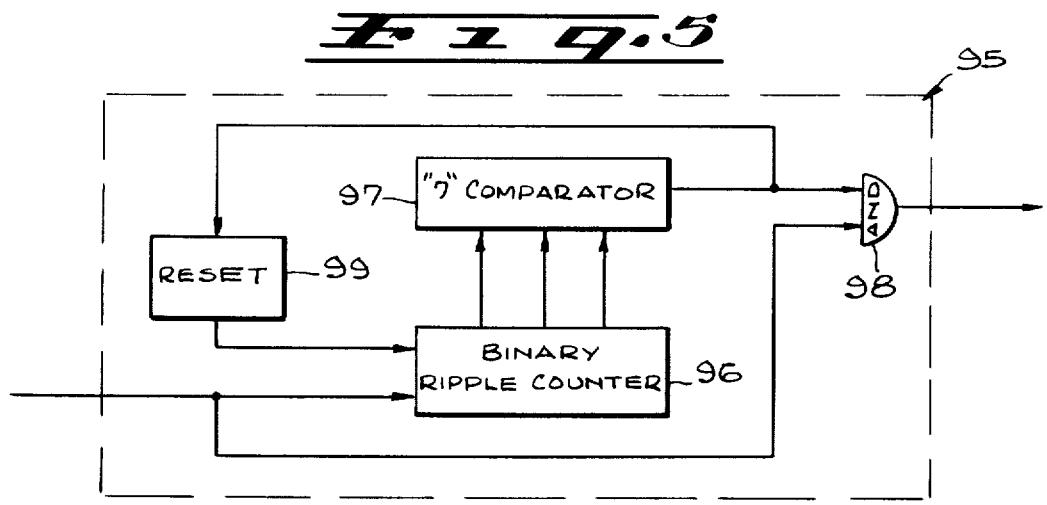
Fig. 5
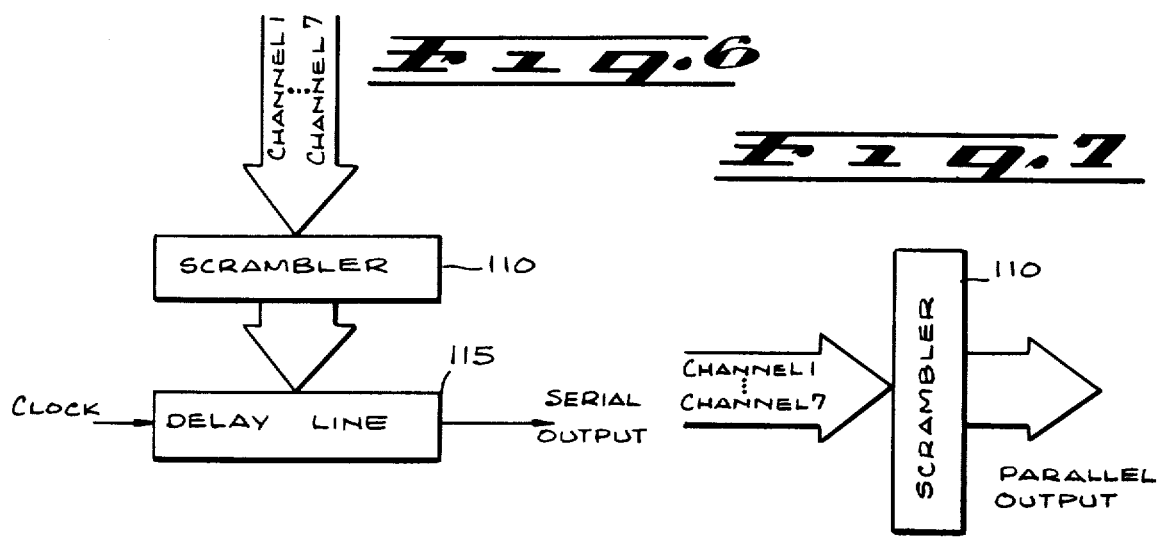
Fig. 6
Fig. 7
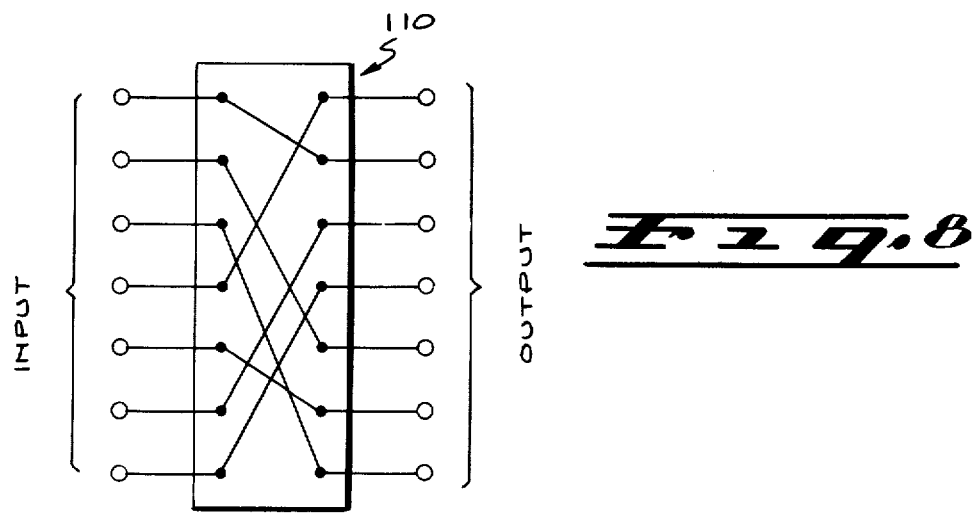
Fig. 8

DIGITAL DATA REFORMATTER/DESERIALIZER

BACKGROUND OF THE INVENTION

1. Origin of the Invention

The invention described herein was made in the performance of work under a NASA contract and is subject to the provisions of Section 305 of the National Aeronautics and Space Act of 1958, Public Law 85-568 (72 Stat. 435; 42 USC 2457).

2. Field of the Invention

This invention relates generally to digital data reformatting and, in particular, to methods and apparatus for combining such reformatting with a transformation from serial input to parallel output.

3. Description of the Prior Art

There are numerous instances where it is desirable to convert serially received binary digital data into a parallel format for further processing and/or transmission. In such applications it is often necessary to reformat the data, so that each channel of output data represents a certain identifiable portion of the input data.

For example, in television surveillance from an earth staellite, a television vidicon tube, may be scanned to generate picture data, having a serial format consisting of an ordered sequence of "pixels" (i.e., digital data words), each consisting of an ordered sequence of binary data bits. Each pixel represents a picture "dot", and, normally, consists of seven such data bits, which are not weighted —i.e., the value represented by a pixel is simply the sum of its bit values. Each pixel represents, through the sum of its bit values, the degree of black/white tonal intensity represented by its corresponding scanned dot.

In order to prevent catastrophic data loss during intermittent system malfunction, it is desirable to both transmit and record such satellite vidicongenerated data in parallel, rather than serially. In this manner, a number of separate channels, each with a reduced bit rate can be used. It is further desirable to reformat the serial data such that a single channel is assigned to a given pixel position within all data blocks. If, for example, there are seven pixels per block, seven channels would be required.

If the data from a specific pixel in all data blocks are transmitted, received and recorded on their separate channel, a system malfunction affecting the transmission or recording of that channel will only affect one pixel in each of the blocks affected. The remaining six pixels (on the other channels) in the same blocks as the lost pixels would supply six-sevenths of the data inherent in the particular block, which would suffice for most applications. Furthermore, since the bit transmission rate of each channel is only one-seventh of what it would be in the case of serial transmission, only one-seventh as much data would be affected by such a system malfunction of specified duration.

There are circuits available to accomplish this task of reformatting and de-serializing digital data. For example, as shown in FIG. 1, a dual register apparatus may be employed. Here, the data is serially loaded into the input register 52. At a particular pulse from the clock 58, the data is shifted in parallel to a reformatting logic circuit 54, which rearranges the data in a specified manner. Another pulse from the clock shifts the data from the reformatting logic circuit into the output register 56, from which it is outputted serially, while new data is shifted into the input register. The output register could, of course, be adapted to output its contents in parallel.

While such an apparatus would certainly accomplish the desired task, it is deficient in that it contains redundant hardware, i.e., a complete second register. This superfluous hardware presents two disadvantages —it increases the weight of the total hardware package, and it nearly doubles the potential for hardware malfunction, both of which are serious considerations, particularly in spacecraft applications.

OBJECTS AND SUMMARY OF THE INVENTION

Accordingly, it is an object of the present invention to provide a digital data reformatter and deserializer which does not require the use of dual parallel shift registers.

It is a further object of the present invention to provide a digital data reformatter and deserializer having a single data register which can continuously generate a parallel output from continuously received serial input data.

It is a yet further object of the present invention to provide a method for reformatting and deserializing digital data without the use of dual parallel data registers.

It is a still further object of the present invention to provide a method for generating a continuous parallel output of digital data from a continuous serial input of digital data without the use of dual parallel data registers.

Briefly, the present invention employs a single shift register or plurality of shift registers connected in series, for its primary data storage and reformatting medium. The shift register employed has the capacity for input and output in either a serial or parallel mode.

A block of data words, whose total bit count is normally one more than the totality of bit positions in the shift register, is serially shifted into the shift register until a specified number of data bits (normally, all but the last two) enters. In lieu of the next shift, the contents of the shift register and, normally, one of the remaining bits in the block are rearranged (shifted) in parallel, according to a prescribed scheme. After such rearrangement, serial shifting continues until a new data block is in position for bit rearrangement.

When all bits of a rearranged data word have arrived in a specified group of bit positions of the data register (normally, the final ones), they are transferred in parallel into an output buffer, from which they may be outputted in parallel to a number of separate output channels, after a specified delay.

Further objects and the many advantages of the subject invention will be more readily appreciated as the same becomes better understood by reference to the following detailed description which is to be considered in connection with the accompanying drawings wherein like reference symbols designate like parts throughout the figures thereof.

BRIEF DESCRIPTION OF THE DRAWINGS

FIG. 1 is a functional block diagram of a prior art digital data reformatter.

FIG. 2 is a functional block diagram of a four-bit serial/parallel input/output shifter register, adaptable for use in the present invention.

FIG. 3 is a schematic block diagram of the digital data reformatter and deserializer of the preferred embodiment of the present invention.

FIG. 4 is a logic block diagram of a parallel shift command module according to an embodiment of the present invention.

FIG. 5 is a logic block diagram of an output shift command module according to an embodiment of the present invention.

FIG. 6 is a logic block diagram of an output scrambler-serializer adaptable for use in connection with the present invention.

FIG. 7 is a logic block diagram of an output scrambler adaptable for use in connection with the present invention.

FIG. 8 is a schematic diagram of an embodiment of the scrambler shown in FIGS. 6 and 7.

DETAILED DESCRIPTION OF THE PREFERRED EMBODIMENT

The serial data continuously received by the apparatus of the present invention consists of a sequence of data words, each consisting of a sequence of binary data bits. For convenience in discussing the invention and its use, we will define n as the number of bits per word, B as the serial bit position of a given bit in its word, W as the serial position of the particular word within its data block. The first word of a given block to enter the data register has word position 1; the first bit to enter the data register is bit 1 of word 1; etc. We will assume that all words consist of the same number of bits, and all blocks consist of the same number of words.

Referring now to FIG. 2, the shift register 60 is the type of shift register utilized in the data register of the preferred embodiment of the present invention. Data can be serially shifted into this particular device through the serial input and can be serially shifted out of the device through the serial output. A pulse from an external serial shift command governs this activity in a conventional manner. Likewise, data can be shifted into the device in parallel through the parallel input terminals, EFGH, and shifted out in parallel through the parallel output terminals, ABCD. This activity is governed by a pulse from an external parallel shift command, also in a conventional manner.

The device shown in FIG. 2, a four-bit shift register of the type described, is typified by the Model 54L95 IC, manufactured by several companies. Since the normal data block processed by the apparatus of the present invention will consist of far more than four bits, a shift register with a far larger number of bit positions (actually, one less than the number of bits in each block) would be required. Such a configuration can easily be realized by serially connecting a number of devices such as shown in FIG. 2, or by utilizing a much "longer" single shift register of the type described.

For the immediately ensuing discussion, we will assume that each data word is a pixel of seven bits, and that there are seven pixels in each data block. It will subsequently be shown that the teachings herein presented can be generalized to cover data blocks of virtually any size and regular internal logical structure.

Referring now to FIG. 3, the data register of the preferred embodiment of the present invention consists of a series of elemental shift registers 61–72, each of the type shown in FIG. 2. Serial data is fed into the initial one of these elements 61; its final output terminal 4 is connected as the input to the second element 62; etc.

The input to the final element 72 is from the final output terminal 44 of the penultimate element 71.

It will be noted that in FIG. 3 each of the successive bit positions of the total data register is numbered sequentially, from position (output terminal) 1, which is the first position in element 61, to the final position 48, which is the final terminal of the final element 72.

The final seven bit positions (42–48) of the 48-bit shift register are connected as inputs to the output buffer 102, consisting of two four-bit elements 100 and 101. Thus, terminals 42–45 are inputs to element 100, while terminals 46–48 are inputs to element 101. Accordingly, the output buffer has sufficient capacity to contain a single pixel of seven bits. The buffer elements shown are four-bit elements. However, since the output buffer 102 is an entirely conventional parallel input/output buffer device, it can consist of any such device or devices of any total number of positions sufficient to hold a single data word.

The output from the output buffer 102 consists of a seven channel parallel data stream. The data transmitted on channel 1 consists only of data from words in the first word position in each data block, the data being transmitted in bit order from bit 1 to bit 7. The data transmitted over channel 2 is entirely analgous, except that it consists of bit values from words in the second word position of the data blocks. Channels 3 to 7 are entirely parallel, in this manner, to channels 1 and 2.

Accordingly, a given block of data is fed into the first element 61 of the data register in the following order: word 1 bit 1, word 1 bit 2, word 1 bit 3 . . . word 1 bit 7, word 2 bit 1 . . . word 7 bit 7. On the other hand, that same data block will be outputted from the output channels in parallel as follows: channel 1 will carry word 1 bit 1 at the same time channel 2 is carrying word 2 bit 1, etc.; next, channel 1 will carry word 1 bit 2, while channel 2 is carrying word 2 bit 2, etc. The output time for the entire data block will be identical to the input time, i.e., the output frequency per channel is one-seventh as great as the input frequency, since seven parallel channels are used at the output.

The shifting operations within the data register and output buffer 102 are ultimately controlled by a high frequency clock 80 which, in turn, activates a parallel shift command module 85 and an output shift command module 95. The high frequency clock is an entirely conventional crystal clock, and its frequency can be selected according to the rate and volume of data processing which is to be accomplished. Since the fastest rate at which the model 54L95 IC's operate reliably is in the vicinity of 2.5 mHz, it is desirable, when employing such devices as the data register elements 6172, to employ a clock generating a pulse frequency of about 2 mHz.

In our example, wherein a 48-bit data register is employed, and a sequence of 49-bit data blocks is processed, the high frequency clock 80, during each 49-period cycle (in which an entire data block is processed), shifts each element of the data register 47 times, then skips a pulse (the 48th) after which it again activates the elements once, completing the cycle. Accordingly, the output from the high frequency clock is NAND-gated with the output from the parallel shift command module 85 by means of a NAND-gate 91. The parallel shift command module generates a single pulse during each 49-period cycle, corresponding, in time, to omitted shift 48. Thus, by NAND-gating the two outputs, the 48th pulse from the high frequency clock is prevented from reaching the data register.

Accordingly, for the first 47 bit period in each data block cycle, the first 47 bits of a particular data block are serially shifted into and through the sequential elements of the data register. As a result, bit 1 of the data block occupies bit position 47 (in data register element 72), bit 2 occupies bit position 46, etc. Bit 47 occupies bit position 1, in element 61. Again, the input data is formatted so that bit positions 41–47, inclusive, contain bits 7-1, respectively, of pixel (word) 1 of the particular data block at this time. Bit positions 34–40 contain, serially in reverse order, the bits of word 2, etc.

During the 48th clock period, a rearrangement of bits within the data register is accomplished, so that after the rearrangement, the data is formatted to cause the final seven bit positions of the data register to contain (in reverse order) bit 1 from all seven pixels of the data block. The penultimate seven bit positions contain bit 2 from each of the seven words (again, in reverse order), etc. Furthermore, the rearrangement fills the data register, i.e., it not only rearranges the bits as indicated, but it also introduces the 48th bit of the data block into the data register (at bit position 7).

The following table shows the contents of the 48 bit positions of the data register before and after rearrangement according to this scheme. In this table, the "0" data register bit position represents the position of the next bit to be entered into the data register, i.e., the one which would enter bit position 1 in element 61 if a single serial shift were to be accomplished.

| DATA REGISTER BIT POSITION | CONTENTS BEFORE REARRANGEMENT | | CONTENTS AFTER REARRANGEMENT | |
|---|---|---|---|---|
| | WORD | BIT | WORD | BIT |
| 0 | 7 | 7 | | |
| 1 | 7 | 6 | 7 | 7 |
| 2 | 7 | 5 | 6 | 7 |
| 3 | 7 | 4 | 5 | 7 |
| 4 | 7 | 3 | 4 | 7 |
| 5 | 7 | 2 | 3 | 7 |
| 6 | 7 | 1 | 2 | 7 |
| 7 | 6 | 7 | 1 | 7 |
| 8 | 6 | 6 | 7 | 6 |
| 9 | 6 | 5 | 6 | 6 |
| 10 | 6 | 4 | 5 | 6 |
| 11 | 6 | 3 | 4 | 6 |
| 12 | 6 | 2 | 3 | 6 |
| 13 | 6 | 1 | 2 | 6 |
| 14 | 5 | 7 | 1 | 6 |
| 15 | 5 | 6 | 7 | 5 |
| 16 | 5 | 5 | 6 | 5 |
| 17 | 5 | 4 | 5 | 5 |
| 18 | 5 | 3 | 4 | 5 |
| 19 | 5 | 2 | 3 | 5 |
| 20 | 5 | 1 | 2 | 5 |
| 21 | 4 | 7 | 1 | 5 |
| 22 | 4 | 6 | 7 | 4 |
| 23 | 4 | 5 | 6 | 4 |
| 24 | 4 | 4 | 5 | 4 |
| 25 | 4 | 3 | 4 | 4 |
| 26 | 4 | 2 | 3 | 4 |
| 27 | 4 | 1 | 2 | 4 |
| 28 | 3 | 7 | 1 | 4 |
| 29 | 3 | 6 | 7 | 3 |
| 30 | 3 | 5 | 6 | 3 |
| 31 | 3 | 4 | 5 | 3 |
| 32 | 3 | 3 | 4 | 3 |
| 33 | 3 | 2 | 3 | 3 |
| 34 | 3 | 1 | 2 | 3 |
| 35 | 2 | 7 | 1 | 3 |
| 36 | 2 | 6 | 7 | 2 |
| 37 | 2 | 5 | 6 | 2 |
| 38 | 2 | 4 | 5 | 2 |
| 39 | 2 | 3 | 4 | 2 |
| 40 | 2 | 2 | 3 | 2 |
| 41 | 2 | 1 | 2 | 2 |
| 42 | 1 | 7 | 1 | 2 |
| 43 | 1 | 6 | 7 | 1 |
| 44 | 1 | 5 | 6 | 1 |
| 45 | 1 | 4 | 5 | 1 |
| 46 | 1 | 3 | 4 | 1 |
| 47 | 1 | 2 | 3 | 1 |
| 48 | 1 | 1 | 2 | 1 |
|  |  |  | 1 | 1 |

This rearrangement, during the 48th clock period, is accomplished by means of a specified interconnection of the input and output terminals of the various elements comprising the data register, and is activated by a single pulse from the parallel shift command module 85. FIG. 3 shows how the elements are interconnected, the bottom terminals of each element representing the inputs thereto and the top terminals representing the outputs (and also the data register bit positions within the element). Thus, using element 61 as an example, its first (leftmost) input terminal is connected to output terminal (i.e., bit position) 6, which is in element 62. Likewise, the second input to element 61 is connected to the output from bit position 13, which is in element 64. FIG. 3 clearly shows the remaining interconnections and, in particular, shows that the input to the third bit position in element 62 comes from the "0" bit position.

There are numerous means which may be employed to generate the required activation pulse at the 48th clock period.

FIG. 4 shows an exemplary embodiment of a parallel shift command module 85 to accomplish this. Here a binary ripple counter 86 accumulates a continuous binary count, as each successive pulse from the high frequency clock 80 is generated. The instantaneous count is continuously compared with the contents of a "48" comparator 87, a conventional binary comparator, in which is stored the binary number "48". When the count in the binary ripple counter reaches "48", a single pulse is generated from the "48" comparator, and this is AND-gated with the clock pulse by means of an AND-gate 88, to produce the desired parallel shift activation pulse.

The ripple counter is reset by the pulse which is generated by the comparator. However, since our present assumption calls for a 49-period cycle, the counter cannot be reset until it has reached the count of "49". Accordingly, a 1-bit delay 89 intervenes between the comparator pulse and the reset mechanism. This delay, which can be implemented as a simple 2-bit-position shift register, is activated by the clock pulses. The output from the delay, which will occur at the 49th clock period, activates a conventional reset mechanism 90 which, in turn, resets the binary ripple counter 86 to "0".

Thus, the desired rearrangement of the bits within the 48 bit positions of the data register is accomplished. In particular, this rearrangement causes all "bit 1's" in the data block to appear simultaneously (in reverse order) at bit positions (and output terminals) 42-48. Simultaneously, these "bit 1's" each appear in their assigned bit positions in the two elements 100, 101 of output buffer 102 for temporary storage. As shown in FIG. 3, and in accordance with the hereinabove described bit rearrangement, bit 1 of word 1 appears in the rightmost bit position of the buffer, while bit 1 of word 7 appears in the leftmost position. The contents of the output buffer are stored for seven clock periods, after which time they are simultaneously fed into the output lines, channels 1 to 7.

This operation is activated by the output shift command module 95, which is much like the parallel shift command module 85. As shown in FIG. 5, this device preferably comprises a binary ripple counter 96, which counts pulses from the high frequency clock 80; a "7" comparator 97, which generates a pulse when the count of "7" achieved in the binary ripple counter; a conventional reset mechanism, activated by the comparator output pulse, which resets the binary ripple counter; and an AND-gate 98, whose inputs are the comparator pulse and clock pulse, and whose output is the necessary activation pulse for the output buffer.

Thus the first group of bits in the new format are simultaneously dumped into the seven output channels.

The 49th pulse from the high frequency clock 80 causes the final, 49th, bit of the data block to be shifted into the position 1 in element 61. It will be noted that this bit is already in its proper position in the new format.

At this point, a new 49-bit cycle automatically begins, and bits are serially shifted through the data register. Every 7th clock period, the contents of the output buffer 102 are emptied, causing the instantaneous contents of bit positions 42–48 to be simultaneously loaded into their proper positions in the buffer. They are stored there for seven clock periods, and outputted into the seven output channels, at which time they are replaced by a new group of seven bits.

It can be seen, therefore, that data processing by means of this apparatus is continuous, and a vast sequence of data blocks can be processed quite rapidly.

Thus far we have assumed that the data blocks being processed each consist of seven sequential words, the latter each containing seven sequential bits of binary information. It is by no means necessary to restrict the present invention to such a data configuration.

We will now assume a generalized data block of m words each containing n data bits. We will also assume that all data blocks are consistent in this respect, and that they are originally formatted in the same manner as in our previous example, i.e., the data bits are introduced in the following order: word 1 bit 1, word 1 bit 2, word 1 bit 3, etc. Finally, we shall assume that the data is to be reformatted into the same configuration as in our previous example, with m parallel output channels, each representing a single one of the word positions within the data blocks.

With these assumptions, this generalized apparatus is configured as follows:

Since there are nm bits in each data block the bit capacity of the data register would necessarily be nm - 1. Likewise, since there are m words in each data block, there would be m bit positions in the output buffer 102 and m output channels. Correspondingly, the last m output terminals in the data register would each be connected as the input to a particular bit position in the output buffer. In the parallel shift command module 85, the comparator 87 would be an "nm - 1" comparator. Likewise, in the output shift command module 95 the "7" comparator 97 would be an "m" comparator.

The interconnections between the bit positions in the data register are determined according to:

$$I = nm - [(B - 1)m + W] \qquad (1)$$

where $I$ = the bit position in the data register whose input is to be interconnected with the output terminal corresponding to the particular data bit which is to be "moved" during reformatting;

$m$ = the number of data words per data block;

$n$ = the number of bits per data word;

$B$ = the relative position of the bit to be moved within its original data word (i.e., its bit position); and $W$ = the relative position of the word containing that bit, in its original data block.

It should be carefully noted, at this juncture, that the concept of bit position is here used in two different ways. The bit position of a bit within its word refers to the sequential ordering of bits within that word. Bit position, in reference to the data register, means the sequence of bit positions of the shift register itself, beginning with 1 at the input end and ending with nm - 1 at the opposite end. Thus, since the data in each block is loaded in order of increasing bit position within data words and increasing word position within the data block, when the data are stored in the data register just prior to rearranging (at the (nm - 1)th clock period), the lowest relative bit and word positions of the data will be stored in the highest bit positions of the data register, and vice versa.

The quantities B and W in formulat (1) are calculated by first calculating a quantity A:

$$A = \frac{nm - (p + 2)}{n}, \qquad (2)$$

where $p$ = the bit position in the data register occupied by the particular data bit to be "moved".

Having calculated A, which will, in most cases, constitute a whole number and a fraction, W is simply the whole number plus 1, while B is simply the numerator of the fraction (if any) plus 1.

Having described in detail the reformatter/deserializer of a preferred embodiment of the present invention, attention will not be directed to certain additional embodiments which will be useful in certain applications.

Referring now to FIG. 6, it may be desirable, in some applications to scramble the final outputs, by rearranging channels, and reserializing the resultant into a scrambled serial output. This is accomplished by passing the m-channel output, in parallel, through a scrambler 110, which rearranges the channel sequence. The output from the scrambler is fed in parallel into a delay line 115 and outputted serially. The delay line is operated by the same high frequency clock 80 which governs the other elements of the overall apparatus.

As shown in FIG. 7, the delay line 115 can be dispensed with, if only a channel-scrambled parallel output is desired.

In either case, the scrambler 110 can consist of no more than a bank of input terminals and a bank of output terminals which are interconnected in some prescribed fashion, as shown, for example, in FIG. 8.

The reformatting capability of the preferred embodiment of the present invention can, particularly with the use of the aforementioned scrambler concepts, be utilized as a cryptographic device. The various terminals of the elements of the data register can be interconnected in any desired fashion for bit scrambling in a known manner. Likewise, the scrambler 110 can be embodied in several devices, each with a different internal scrambling arrangement, fashioned into plug-in modules. In any event, since the scrambling pattern of the overall apparatus is completely known, descrambling can be accomplished in a relatively simple manner by an authorized receiver.

Ordinary frequency division can be accomplished by means of the present apparatus by simply eliminating the parallel shift command module 85. This will result in a frequency division factor of m (7, in the embodiment shown in FIG. 3).

While a preferred embodiment of the present invention has been described hereinabove, it is intended that all matter contained in the above description and shown in the accompanying drawings to be interpreted as illustrative and not in a limiting sense and that all modifications, constructions and arrangements which fall within the scope and spirit of the invention may be made.

What is claimed is:

1. Apparatus for reformatting and deserializing a continuous series of digital data blocks, each of said data blocks comprising an ordered series of m data words, each of said data words comprising an ordered series of n data bits, said apparatus comprising:

shift register means containing at least nm - 1 sequential bit positions, said shift register means adapted to sequentially receive the bits of said block and shift said bits serially, said shift register means further adapted to selectively receive and output bit values at selected bit positions therein;

parallel shift command means to selectively cause bit values from selected ones of said bit positions to be inputted to selected other ones of said bit positions, in prescribed one-to-one correspondence in accordance with the relationship:

$$I = nm - [(B - 1)m + W]$$

where:

I = the sequential bit position, within said shift register means, at which a given binary datum is to be received;
n = the number of data bits in each data word;
m = the number of data words in each data block;
B = the ordered bit position, within its data word, of said given binary datum; and
W = the ordered word position, within the data block, of the data word containing said given datum;

output buffer means having at least m bit positions, to selectively receive, from a selected group of m bit positions in said shift register means, the bit values therein;

clock means to generate command pulses to activate said shift register means, said parallel shift command means responsive to said command pulses; and output shift command means, responsive to said command pulses, to generate secondary pulses to activate said output buffer means.

2. The apparatus as defined in claim 1, wherein said parallel shift command means includes output-to-input interconnections between prescribed pairs of said bit positions within said shift register in accordance with said relationship.

3. The apparatus as defined in claim 2, wherein said interconnections interlink at least nm - 2 of said pairs.

4. The apparatus as defined in claim 3, wherein n = m.

5. The apparatus as defined in claim 4, wherein n = 7.

6. The apparatus as defined in claim 2, wherein said parallel shift command means is adapted to cause shifting of data through said interconnections during the (nm - 1)th clock period of said clock means.

7. The apparatus as defined in claim 6, wherein said shift register means comprises a single shift register.

8. The apparatus as defined in claim 6, wherein said shift register means comprises a plurality of serially-linked shift-registers.

9. The apparatus as defined in claim 2, wherein said output shift command means is adapted to generate one of said secondary pulses in response to m of said command pulses.

10. The apparatus as defined in claim 9, wherein said group of bit positions comprises a contiguous series of m bit positions.

11. The apparatus as defined in claim 10, wherein the last of the bit positions in said contiguous series is the (nm - 1) bit position of said data register.

12. The apparatus as defined in claim 10, further including m parallel primary output channel means, each adapted to selectively receive the bit values in a specified one of the bit positions in said output buffer means.

13. The apparatus as defined in claim 12, further including scrambler means to convert said m primary output channels to m secondary output channels, the sequential ordering of said secondary output channels differing from that of said primary output channels in a predescribed fashion.

14. The apparatus as defined in claim 13, further including reserializing means to receive data from said secondary output channels in parallel and to generate, therefrom, a serial output data stream.

* * * * *